US010410892B2

(12) United States Patent
Lu et al.

(10) Patent No.: US 10,410,892 B2
(45) Date of Patent: Sep. 10, 2019

(54) METHOD OF SEMICONDUCTOR WAFER BONDING AND SYSTEM THEREOF

(71) Applicant: TAIWAN SEMICONDUCTOR MANUFACTURING COMPANY LTD., Hsinchu (TW)

(72) Inventors: Kuan-Liang Lu, Pingtung County (TW); Xin-Hua Huang, Changhua County (TW); Yeur-Luen Tu, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 81 days.

(21) Appl. No.: 15/356,368

(22) Filed: Nov. 18, 2016

(65) Prior Publication Data

US 2018/0144999 A1    May 24, 2018

(51) Int. Cl.
*H01L 23/00* (2006.01)
*H01L 25/00* (2006.01)
*H01L 21/67* (2006.01)
*H01L 25/065* (2006.01)
*H01L 23/544* (2006.01)
*H01L 21/66* (2006.01)

(52) U.S. Cl.
CPC ........ *H01L 21/67288* (2013.01); *H01L 22/12* (2013.01); *H01L 22/20* (2013.01); *H01L 23/544* (2013.01); *H01L 24/80* (2013.01); *H01L 25/0657* (2013.01); *H01L 25/50* (2013.01); *H01L 2223/5442* (2013.01); *H01L 2223/54426* (2013.01); *H01L 2223/54453* (2013.01); *H01L 2224/8013* (2013.01); *H01L 2224/80013* (2013.01); *H01L 2224/80052* (2013.01); *H01L 2224/80894* (2013.01); *H01L 2225/06524* (2013.01); *H01L 2225/06593* (2013.01)

(58) Field of Classification Search
CPC ... H01L 25/0657; H01L 24/80; H01L 23/544; H01L 21/67288; H01L 22/12; H01L 22/20; H01L 2225/06593; H01L 2225/06524; H01L 2224/80894; H01L 2224/8013; H01L 2224/80052; H01L 2224/80013; H01L 2223/54426; H01L 2223/5442; H01L 2223/54453; H01L 25/50

See application file for complete search history.

(56) References Cited

U.S. PATENT DOCUMENTS 5,478,782 A * 12/1995 Satoh ................ H01L 21/76251
                                              148/DIG. 12
7,479,441 B2 * 1/2009 Kirk ..................... H01L 21/187
                                              257/E21.088

(Continued)

*Primary Examiner* — Savitri Mulpuri
(74) *Attorney, Agent, or Firm* — WPAT, P.C., Intellectual Property Attorneys; Anthony King

(57) ABSTRACT

A method of semiconductor wafer bonding and system thereof are proposed. A first alignment mark of a first semiconductor wafer is aligned with a second alignment mark of a second semiconductor wafer. A partial attachment is performed between the first semiconductor wafer and the second semiconductor wafer. A scanning is performed along a direction substantially parallel to a surface of the first semiconductor wafer. It is determined if a bonding defect of the partially attached first semiconductor wafer and the second semiconductor wafer exists.

17 Claims, 7 Drawing Sheets

(56) References Cited

U.S. PATENT DOCUMENTS

| | | | | |
|---|---|---|---|---|
| 7,722,793 B2* | 5/2010 | Gueguen | B23K 26/34 | 264/447 |
| 7,883,939 B2* | 2/2011 | Chida | H01L 21/6835 | 257/E21.517 |
| 7,948,034 B2* | 5/2011 | George | H01L 21/67092 | 257/347 |
| 8,038,897 B2* | 10/2011 | Hung | G03F 1/84 | 216/37 |
| 8,110,804 B2* | 2/2012 | Habib | G01N 21/9505 | 250/332 |
| 8,153,901 B2* | 4/2012 | Kondo | H05K 3/4617 | 174/250 |
| 8,489,227 B2* | 7/2013 | Maeda | H01L 21/67092 | 156/60 |
| 8,889,441 B2* | 11/2014 | Takai | H01L 21/50 | 257/E21.001 |
| 9,136,186 B2* | 9/2015 | Yang | H01L 21/67288 | |
| 9,372,176 B2* | 6/2016 | Escobar-Ruiz | G01N 29/4454 | |
| 9,385,104 B2* | 7/2016 | Tani | H01L 24/75 | |
| 9,508,586 B2* | 11/2016 | Huang | H01L 21/6838 | |
| 9,576,827 B2* | 2/2017 | Liu | H01L 25/50 | |
| 9,646,860 B2* | 5/2017 | Huang | H01L 24/94 | |
| 2014/0020818 A1* | 1/2014 | Huang | H01L 21/67092 | 156/152 |
| 2014/0150967 A1* | 6/2014 | Kurimura | B32B 37/12 | 156/275.5 |
| 2014/0183443 A1* | 7/2014 | Coursey | H01L 33/0079 | 257/13 |
| 2015/0214082 A1* | 7/2015 | Huang | H01L 21/67092 | 438/14 |
| 2015/0357226 A1* | 12/2015 | Liu | H01L 25/50 | 156/535 |
| 2016/0111316 A1* | 4/2016 | Huang | H01L 21/6838 | 156/701 |
| 2016/0131557 A1* | 5/2016 | Bossi | G01N 1/00 | 264/400 |
| 2016/0204020 A1* | 7/2016 | Huang | H01L 21/67092 | 156/285 |
| 2017/0330855 A1* | 11/2017 | Tung | H01L 24/83 | |

* cited by examiner

METHOD OF SEMICONDUCTOR WAFER BONDING AND SYSTEM THEREOF

BACKGROUND

Electronic equipment involving semiconductive devices is essential for many modern applications. Technological advances in materials and design have produced generations of semiconductive devices where each generation incorporates smaller and more complex circuits than the previous generation. In the course of advancement and innovation, the formation of semiconductor devices usually involves bonding of two or more semiconductor wafers. Examples of wafer bonding include hydrophilic bonding and hydrophobic bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
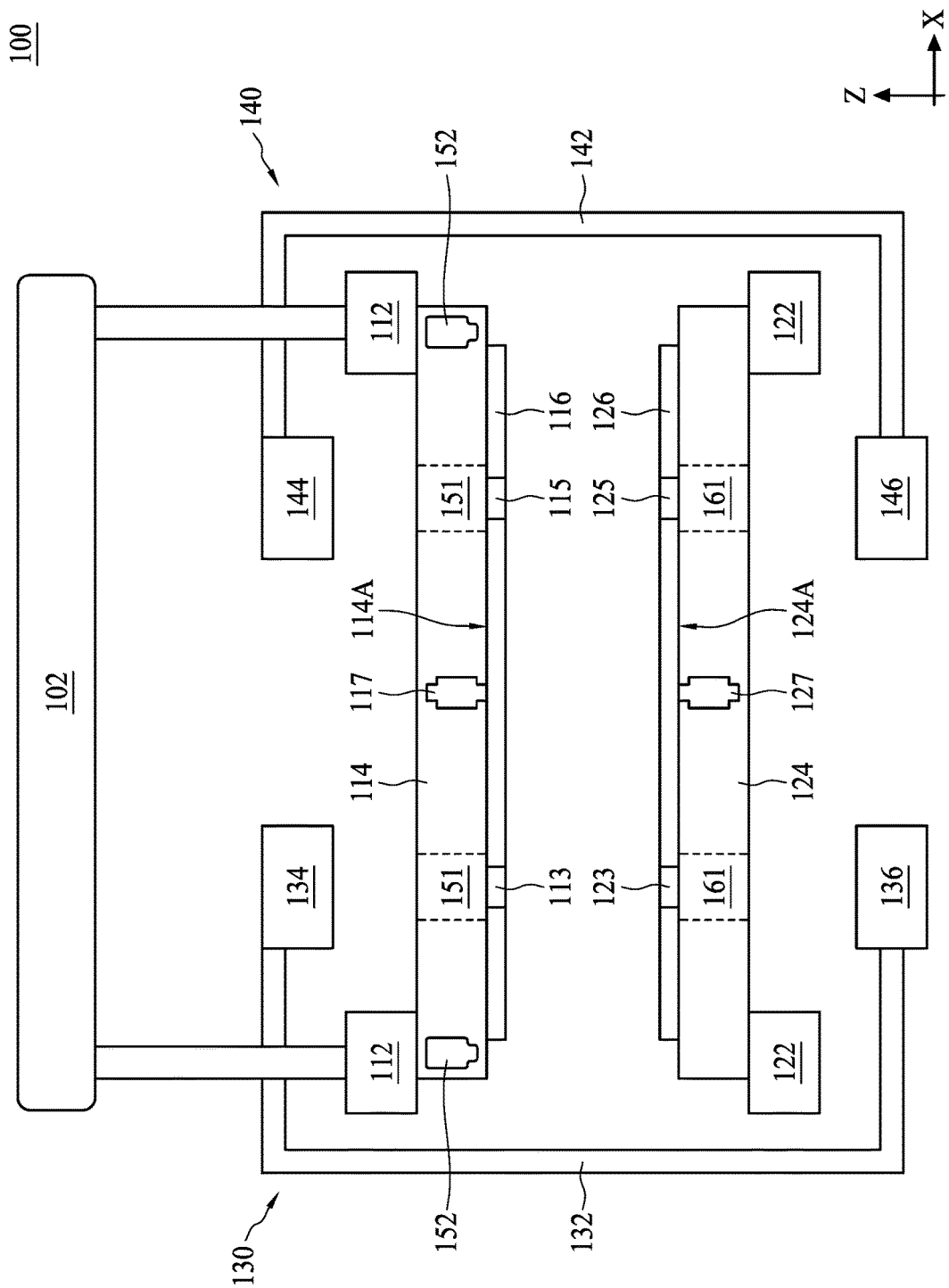
FIG. 1 is a schematic view of a wafer bonding system configured in an initialization phase, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Modern semiconductor devices have incorporated more and more functionalities along with continuing reductions in size. In order to manufacture semiconductor devices with efficiency and low cost, discrete device chips or wafers are bonded and electrically interconnected. A device package may be formed accordingly. Among the various semiconductor bonding technologies, wafer-to-wafer bonding involves attachment and electrical interconnection of device units on the wafers before the devices are diced into chips. Wafer-to-wafer bonding technologies require precise alignment between the wafers. Moreover, caution should be exercised in order not to leave undesired gaps or voids at the interface of the attached wafers. If an undesired void or misalignment is found in the bonded wafers, a rework procedure may be necessary to fix the problem, or a bonding failure may occur. However, existing equipment and bonding methods are inadequate in monitoring the alignment performance in-situ. As a result, manufacturing yields and cycles are adversely affected.

In the present disclosure, a wafer bonding system is presented which meets both current and future requirements for alignment. A movable imaging device is proposed that includes a radiation source and an image sensor. The mobility of the imaging device can help in inspecting bonding defects across the bonding interface. In addition, inspection of the bonding performance can be conducted as soon as the beginning stage of bonding, when discrete wafers first contact each other. Defects can be detected prior to completion of the process of bonding between the wafers. In addition, an improved method of operation flow for semiconductor wafer bonding is proposed. Therefore, a bonding rework can be introduced in-situ in an efficient manner. The bonding failure rate and corresponding yield loss can be decreased accordingly.

FIG. 1 is a schematic view of a wafer bonding system 100 in accordance with various embodiments of the present disclosure. The wafer bonding system 100 includes a first stage 112, a second stage 122, a first wafer chuck 114, a second wafer chuck 124, a stage support 102, a first imaging device 130, and a second imaging device 140.

The first stage 112 is configured to support and hold the wafer chuck 114. In the illustrated embodiment, the first stage 112 includes at least two ends from a cross-sectional view and the first stage 112 holds the first wafer chuck 114 at the two ends. Similarly, the second stage 122 is configured to support and hold the second wafer chuck 124. In some embodiments, the first stage 112 and the second stage 122 are configured to move the first wafer chuck 114 and the second wafer chuck 124 to determined positions for facilitating wafer-to-wafer bonding operations. In the illustrated embodiment, the stage support 102 includes two arms to hold the first stage 112. The stage support 102 may move the first stage 112 toward the second stage 122 or away from the second stage 122 along the z-direction. In some embodiments, the stage support 102 includes a motor to control the movement of the first stage 112.

The first wafer chuck 114 is held by the first stage 112. The second wafer chuck 124 is mounted on the second stage 122. Each of the first wafer chuck 114 and the second wafer chuck 124 is configured to hold and clamp a workpiece, such as a first semiconductor wafer 116 or a second semiconductor wafer 126, so as to keep the workpiece in place during the process of wafer alignment and bonding. In some embodiments, the first wafer chuck 114 or the second wafer chuck 124 is configured to apply a sucking force upon the workpiece. In some embodiments, the first wafer chuck 114 and the second wafer chuck 124 are vacuum chucks providing vacuum force to hold the workpiece. The first wafer chuck 114 or the second wafer chuck 124 may include vacuum holes (not separately shown) on their surfaces 114A or 124A. In addition, a pump may be used to suck the workpiece by exerting vacuum force through the vacuum holes.

In some embodiments, the first wafer chuck 114 or the second wafer chuck 124 is designed to allow visible or invisible light to pass through. The visible or invisible light serves as an imaging light in the imaging process for an alignment operation. In some embodiments, the first wafer chuck 114 and the second wafer chuck 124 include some transparent portions. For example, a portion 151 of the first wafer chuck 114 or a portion 161 of the second wafer chuck 124 overlapped with the wafer vertically (i.e., in the z-direction) may be made of transparent materials. In some embodiments, the transparent material may be, for example, glass-based material. Alternatively, the first wafer chuck 114 or the second wafer chuck 124 includes a porous structure including holes or openings in the portions 151 or 161, respectively. Thus, the imaging light can pass through the wafer chuck 114 or 124 through the holes or openings.

In some embodiments, the first wafer chuck 114 includes a first push pin 117. The first push pin 117 is retracted below the surface 114A of the first wafer chuck 114 when inactivated. During operation, the first push pin 117 can be activated to protrude from the surface 114A and press the first semiconductor wafer 116. The push pin 117 is configured to exert a force on the first semiconductor wafer 116. The first semiconductor wafer 116 may be pressed to facilitate formation of van der Waals bonds between the semiconductor wafers 116 and 126.

Similarly, the second wafer chuck 124 may include a second push pin 127 in some examples. The second push pin 127 may be activated to protrude from a top surface 124A of the second wafer chuck 124. The push pin 127 may be used for pressing the second semiconductor wafer 126 toward the first semiconductor wafer 116.

In some embodiments, the first wafer chuck 114 or the second wafer chuck 124 may include at least a leveling gauge 152. The leveling gauge 152 is configured to provide measurements on the spacing between the first wafer chuck 114 and the second wafer chuck 124. The measured values of spacing can be used in deriving information of the height and inclination of the first wafer chuck 114. In some embodiments, the leveling gauge 152 is configured to take measurements at different locations, for example at opposite ends near the periphery of the first wafer chuck 114, through any suitable ranging approaches. When the first wafer chuck 114 shifts towards the second wafer chuck 124, the leveling gauge 152 can provide a measurement of vertical displacement along z-direction. In some examples, the leveling gauge 152 may provide several measurements at different locations of the first wafer chuck 114 so as to prevent the first wafer chuck 114 from tilting. Accordingly, bonding gaps of voids may be alleviated during the attachment process between the two semiconductor wafers 116 and 126. In some embodiments, there are several leveling gauges 152 (e.g., two leveling gauges are shown in the illustrated embodiment) spaced apart from one another for taking different measurements.

The imaging device 130 includes a first radiation source 134 and a first imaging sensor 136. The imaging device 130 further includes a first support 132 coupled to the first radiation source 134 and the first imaging sensor 136. The second imaging device 140 includes a second radiation source 144 and a second imaging sensor 146, where the second radiation source 144 and the second imaging sensor 146 are coupled via a second support 142. Each of the first imaging device 130 and the second imaging device 140 is configured to perform optical scanning of the bonded wafers. To implement the optical scanning, the first radiation source 134 or the second radiation source 144 is configured to emit a radiation, such as a visible light or an invisible light (such as infrared) as a light source for the scan. Additionally, the first imaging sensor 136 or the second imaging sensor 146 is configured to receive the light emitted from the first radiation source 134 or second radiation source 144, respectively. The imaging sensors 136 and 146 may generate one or more images of the alignment marks. The alignment accuracy for the semiconductor wafers 116 and 126 is evaluated through the locations of the respective alignment marks. In addition, the imaging sensors 136 and 146 may generate an image of the overlapped first semiconductor wafer 116 and the second semiconductor wafer 126 along the wafer surfaces in order to inspect the bonding void. In some embodiments, the alignment error and bonding void can be evaluated via a same inspection image.

In some embodiments, the first imaging sensor 130 and the second imaging sensor 140 shift along a direction substantially parallel to the surfaces 114A and 124A of the first wafer chuck 114 and the second wafer chuck 124, respectively, i.e., along the x-direction. In some embodiments, the first imaging sensor 130 and the second imaging sensor 140 shift along a direction substantially parallel to the surface of the first semiconductor wafer 116 or the second semiconductor wafer 126. In some embodiments, a motor may be incorporated to shift the imaging devices 130 and 140. Therefore, the coverage of the radiation sources 134 and 144 is effectively enlarged. In conventional bonding systems, the light source of the imaging device is attached to or embedded in the wafer chuck. As a consequence, the conventional imaging devices can only move in the vertical direction (z-direction) along with the wafer chuck, rather than the horizontal direction (x-direction). The disadvantages of such design include the need for the alignment marks to be appropriately disposed within the scanning coverage of the light source. Moreover, the conventional light source cannot easily perform a horizontal scan due to its immobility in the direction along the wafer surfaces. Moreover, the fixed light source cannot easily scan a large surface area, e.g., a shifting distance greater than 2 mm. In contrast, the mobility of the first imaging device 130 or the second imaging device 140 may help provide scan capabilities better than existing systems in terms of scan coverage. In some embodiments, each of the first imaging device 130 and the second imaging device 140 may cover the entire area of the bonded surfaces. In alternative embodiments, the imaging devices 130 and 140 can cooperatively perform a complete scan over the surface 114A or 124A.

In some embodiments, the first imaging device 130 and the second imaging device 140 perform a linear scan on a fixed linear route across the surface 114A or 124A. In some embodiments, the first imaging device 130 and the second imaging device 140 perform a planar scan on a predetermined route across the surface 114A or 124A, where the predetermined route can be a curved route. In some embodiments, the first wafer chuck 114 or the second wafer chuck 124 may be configured to rotate by an angle. As a result, the first wafer chuck 114 and the second wafer chuck 124 can help the alignment scan along a circular direction with respect to the centers of the first wafer chuck 114 and the second wafer chuck 124, respectively. In the illustrated embodiment, two imaging devices are shown. However, other numbers of imaging devices are also within the contemplated scope of the present disclosure.

In some embodiments, the wafer bonding system 100 is configured to generate a relative movement between the wafer chucks 114 and 124 and the imaging devices 130 and 140. In other words, the wafer bonding system 100 causes a relative movement between the semiconductor wafers 116 and 126 and the imaging devices 130 and 140. In some embodiments, the first wafer chuck 114 or the second wafer chuck 124 are movable during bonding. As a result, the scan can cover substantially the entire surfaces of both the first semiconductor wafer 116 and the second semiconductor wafer 126.

The first semiconductor wafer 116 may comprise a first semiconductor substrate, e.g., bulk silicon, doped or undoped, or a layer of a silicon-on-insulator (SOI) substrate. In one embodiment, the first semiconductor substrate includes other semiconductor materials, such as silicon germanium, silicon carbide, gallium arsenide, or the like. The first semiconductor substrate may be a p-type semiconductor substrate (P-Substrate) or an n-type semiconductor substrate (N-Substrate) comprising silicon. Alternatively, the first semiconductor substrate includes another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. The first semiconductor substrate may include doped regions, such as a p-well, an n-well, or combination thereof. In some embodiments, the first semiconductor wafer 116 may be a carrier substrate.

The first semiconductor wafer 116 may also comprise metallization layers over the first semiconductor substrate in which conductive interconnect features are coupled to the first semiconductor substrate. Further, one or more dielectric layers may be formed over the first semiconductor substrate and the metallization layers. A plurality of dies may thus be formed on the first semiconductor wafer 201. These dies may be any suitable type of die, such as a memory die, a logic device die, or combinations thereof. However, any other suitable type of device, such as a system on a chip (SOC) device, may be included.

The second semiconductor wafer 126 may be formed with materials or structures similar to those of the first semiconductor wafer 116. For example, the second semiconductor wafer 126 comprises a second semiconductor substrate formed of materials similar to those of the first semiconductor substrate. Moreover, the second semiconductor may include dielectric or metallization layers over the second semiconductor substrate.

In order to facilitate wafer-to-wafer bonding, the first semiconductor wafer 116 may further include alignment marks, such as first alignment marks 113 and 115, on its surface. Similarly, the second semiconductor wafer 126 may include alignment marks, such as second alignment marks 123 and 125, on its surface. The first alignment marks 113 and 115 and the second alignment marks 123 and 125 are used in positioning the first semiconductor wafer 116 and the second semiconductor wafer 126 for accurate alignment. The alignment marks may be formed on a top surface of the semiconductor wafer 116 or 126. Alternatively, the alignment marks may be formed on a bottom surface opposite the top surface of the semiconductor wafer 116 or 126. The alignment marks may be formed of dielectric materials through patterning a dielectric layer. In some embodiments, the location of the alignment mark is kept off doped features or conductive materials from a top view in the semiconductor wafer, such as the conductive components in the metallization layers, so as to avoid erroneous detection of the alignment marks.

FIG. 1 further illustrates an initial phase of the bonding operation. In the beginning of operation, two workpieces are provided or received. For example, the first semiconductor wafer 116 is placed on the first wafer chuck 114. Similarly, the second semiconductor wafer 126 is placed on the second wafer chuck 124. The first wafer chuck 114 and the second wafer chuck 124 are respectively clamped by the first stage 112 and second stage 122. Once in place, the first alignment mark 113 of the first semiconductor wafer 116 is arranged to substantially correspond to the second alignment mark 123 of the second semiconductor wafer 126 in preliminary alignment. In the meantime, the first alignment mark 115 of the first semiconductor wafer 116 is arranged to substantially correspond to the second alignment mark 125 of the second semiconductor wafer 126. In some embodiments, the preliminary alignment may or may not be performed by the imaging devices 130 and 140. For example, coordinates of the alignment marks are used for preliminary alignment. In some embodiments, the first semiconductor wafer 116 and the second semiconductor wafer 126 are exposed to a pre-bonding treatment. Such treatment can be performed either prior to or subsequent to the placement of the semiconductor wafers 116 and 126. In some embodiments, the pre-bonding treatment includes a plasma process, which is used to activate the wafer surfaces and facilitates a low temperature bonding.

Next, an enhanced alignment operation is performed to match the positions of the first alignment marks 113 and 115 with those of the second alignment marks 123 and 125. The first imaging device 130 and the second imaging device 140 are activated and moved to locate the first alignment marks 113 and 115 and the second alignment marks 123 and 125. When the alignment marks are found to be within the detecting or illuminating range of the radiation sources 134 and 144, the first radiation source 134 or the second radiation source 144 emits imaging light toward the alignment marks. The imaging light penetrates the first wafer chuck 114, the first semiconductor wafer 116, the second semiconductor wafer 126 and the second wafer chuck 124 sequentially, and eventually hits the first imaging sensor 136 or the second imaging sensor 146. Images showing the positions of the alignment marks are displayed. An inspection or calculation operation of the alignment error may be used based on the alignment mark positions displayed on the images. Next, a corresponding fine shift of the wafer check 114 or 124 is performed to reduce the alignment error. The alignment procedure may be regarded as successful when the alignment error falls within a predetermined alignment error threshold. In some embodiments, the alignment procedure may include several operations, such as imaging, inspection and chuck shifting, in an iterative manner to progressively mitigate the alignment error until the alignment is deemed successful.

Figure 2A:
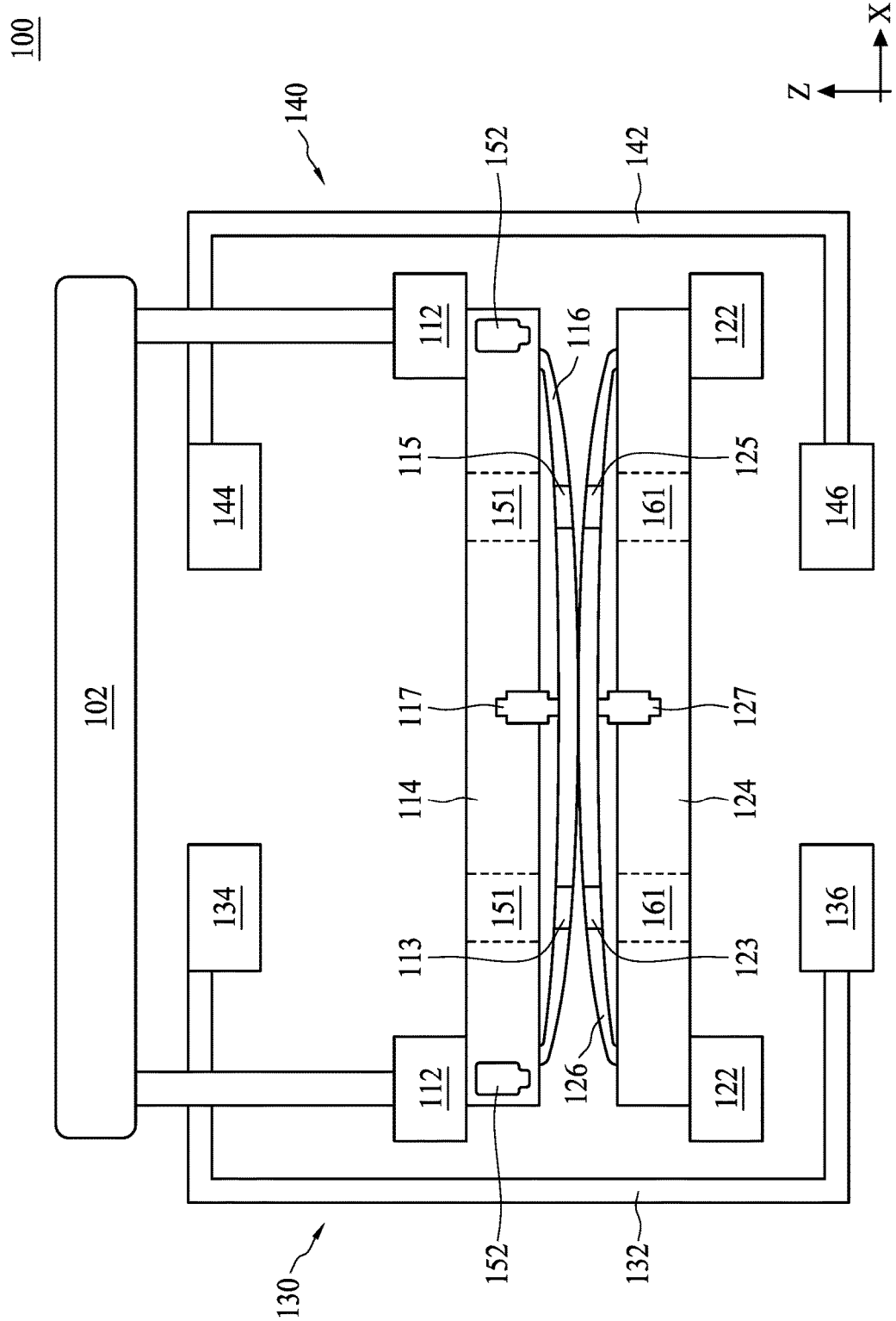
FIGS. 2A and 2B are schematic views of the wafer bonding system shown in FIG. 1 and configured in different intermediate phases, in accordance with various embodiments of the present disclosure.

FIG. 2A is a schematic view of the wafer bonding system 100 shown in FIG. 1 in an intermediate phase, in accordance with various embodiments of the present disclosure. Once the first semiconductor wafer 116 and the second semiconductor wafer 126 are determined to be successfully aligned, the first semiconductor 116 is moved toward the second semiconductor wafer 126. The stage support 102 may move the first wafer chuck 114 in the z-direction to approach the second wafer chuck 124. The first wafer chuck 114 may be stopped before the first semiconductor wafer 116 contacts the second semiconductor wafer 126. The first semiconductor wafer 116 is thus temporarily kept separated from the second semiconductor wafer 126 by a distance. Next, in some embodiments, the first semiconductor wafer 116 is bent to contact the second semiconductor wafer 126. Subsequently, the first semiconductor wafer 116 allows gradually more of its surface area to contact the second semiconductor wafer 126. Eventually, the entire surface of the first semiconductor wafer 116 contacts the entire surface of the second semiconductor wafer 126.

In some embodiments, the first semiconductor wafer 116 is pushed by the push pin 117 to have a curved surface bending toward the second semiconductor wafer 126. As the warped first semiconductor wafer 116 is moved close to the second semiconductor wafer 124, the vertex of the curved surface on the first semiconductor wafer 116 comes into contact with the second semiconductor wafer 126.

Similarly, in some embodiments, the second semiconductor wafer 126 is pushed by the push pin 127. Accordingly, a curved surface facing toward the first semiconductor wafer 116 may be formed on the second semiconductor wafer 126. A vertex of the curved surface on the second semiconductor wafer 126 comes into contact with the first semiconductor wafer 116 while the remaining portions of the second semiconductor wafer 126 are kept separated from the first semiconductor wafer 116. If both of the push pins 117 and 127 are activated, the first semiconductor wafer 116 and the second semiconductor wafer 126 may make an initial contact at their respective vertices.

The warped first semiconductor wafer 116 or the second semiconductor wafer 126 may include a maximal warpage displacement introduced by the push pins 117 or 127, respectively. Furthermore, the first push pin 117 and the second push pin 127 may be aligned with each other for generating corresponding vertices. In some embodiments, the first push pin 117 or the second push pin 127 may be disposed in a center of the respective first wafer chuck 114 or second wafer chuck 124. As a consequence, the first semiconductor wafer 116 and the second semiconductor wafer 126 may include a maximal warpage displacement at the respective centers.

Figure 2B:
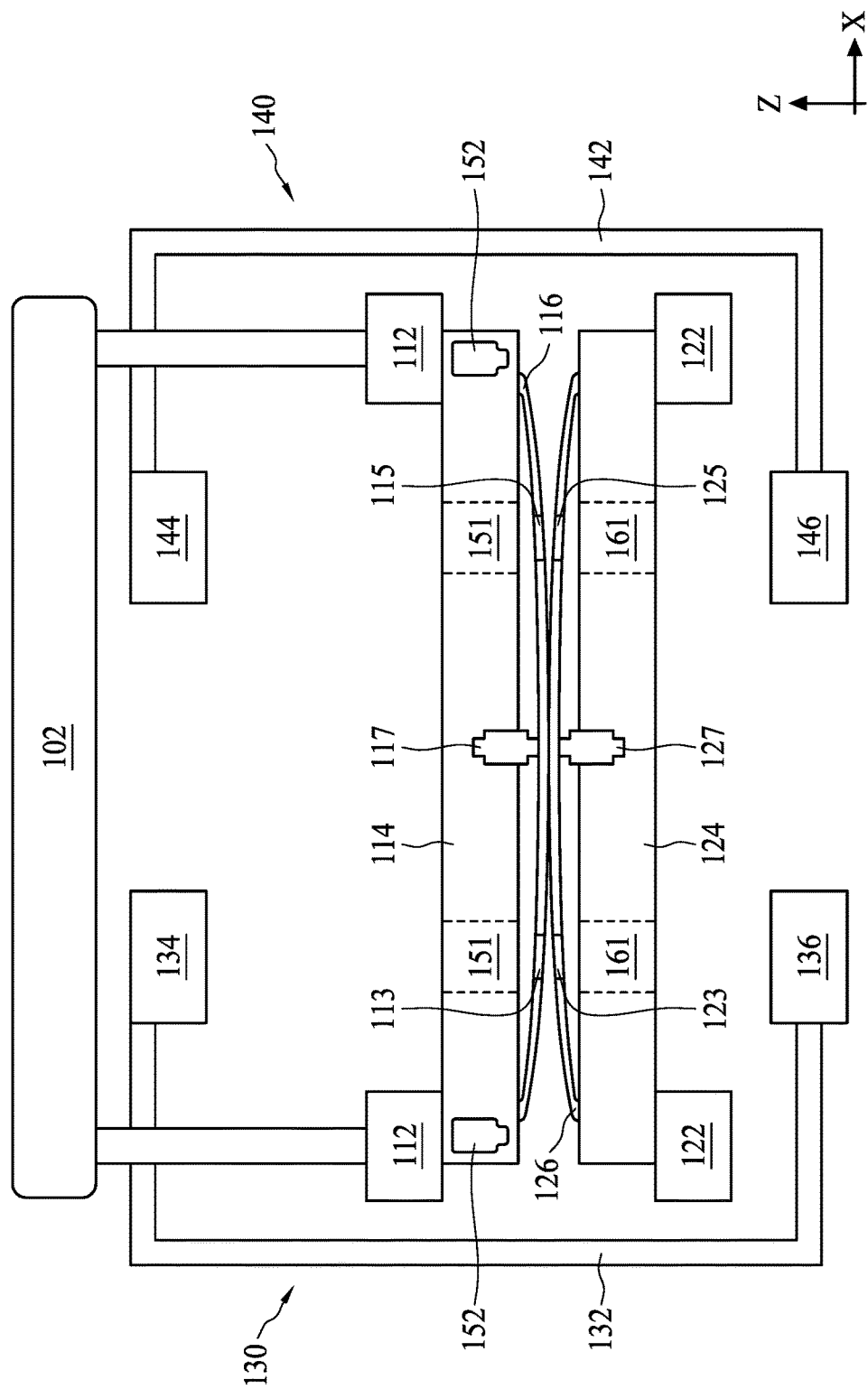

During the period of attachment between the first semiconductor wafer 116 and the second semiconductor wafer 126, the first wafer chuck 114 continues to move the bent first semiconductor wafer 116 toward the second semiconductor wafer 116. The contact area is increased accordingly. As shown in FIG. 2B, the contacted portion may be extended from the centers toward the perimeters of the semiconductor wafers. In the meantime, an inspection of the bonding void may be performed against the contacted portion of the semiconductor wafers. In some embodiments, the inspection is performed in-situ before the first semiconductor wafer 116 and the second semiconductor wafer fully attach. If the inspection of the alignment accuracy or bonding void reveal that the wafer bonding is successful, the first wafer chuck 114 continues to push the first semiconductor wafer 116 to contact more closely with the second semiconductor wafer 126. Otherwise, if the inspection detects that the alignment error exceeds the threshold or a bonding void is found, the first wafer chuck 114 may be stopped from moving forward.

Figure 3:
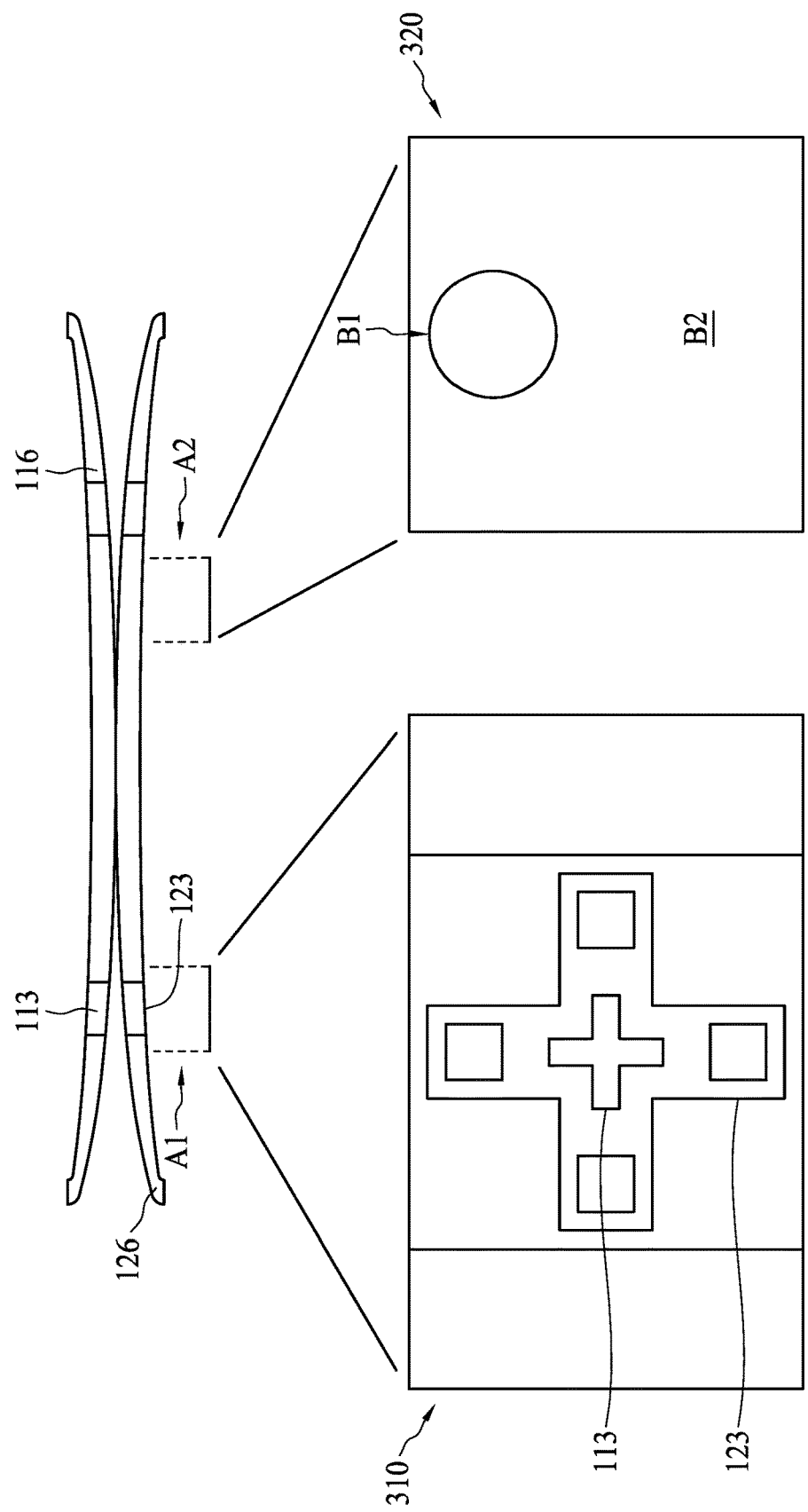
FIG. 3 is a schematic view of inspection images showing the performance of alignment accuracy and bonding voids, respectively, in accordance with various embodiments of the present disclosure.

FIG. 3 is a schematic view of two images 310 and 320 for inspecting the alignment accuracy and the bonding void, respectively, in accordance with various embodiments of the present disclosure. The image 310 shows an inspection image taken by the imaging device 130 at a first area A1 from a top view. The first area A1 contains the first alignment marks 113 and 123 of the first semiconductor wafer 116 and the second semiconductor wafer 126, respectively. As shown in the image 310, the center of the first alignment mark 113 is aligned with the center of the second alignment mark 123. In some embodiments, an alignment error may be detected. The alignment error may be determined by calculating the distance between two reference points on the respective alignment marks 113 and 123. For example, the centers of the two alignment marks 113 and 123 may be used as reference points. Also, a predetermined threshold is determined, such as 2 µm, in order to ensure successful wafer bonding results. If the calculated alignment error exceeds the threshold, it may be determined that an alignment defect is detected. In the illustrated embodiment, the first alignment mark 113 and the second alignment mark 123 include cross shapes of different sizes. However, other shapes can also be used as alignment marks, such as a bar shape or a T-shape.

The image 320 shows an inspection image taken by the first imaging device 130 or the second imaging device 140 at a second area A2 from a top view. The second area A2 of the first semiconductor wafer 116 or the second semiconductor wafer 126 may be spaced from the first area A1. In some embodiments, there are no alignment marks included in the second area A2. The image 320 may be further divided into several blocks or groups of pixels. Each pixel of the image 320 contains a color or grey-scale level. Thus, a distribution or mean value of the pixel color for each block or group is calculated. The gap or void between the first semiconductor wafer 116 and the second semiconductor wafer 126 is detected based on the color distribution of the image 320. In some embodiments, if a block has a color or grey-scale level dissimilar from other blocks, a bonding gap or void within that block may be detected. For example, as illustrated in the image 320, a block B1 shows a darker grey level than other blocks in an area B2. As a result, it may be determined that a bonding void within the block B1 is detected. In some embodiments, the alignment marks 113 and 126 may also be captured in the area A2. Thus, alignment marks may appear in the image 320 for the detection of bonding gap. In that case, the pixels or blocks containing the alignment marks 113 and 123 may not be taken into account in inspection of the bonding void. In the embodiment where alignment marks 113 and 123 appear in the image 320, the alignment error and the bonding void can be examined through the same image 320.

Figure 4:
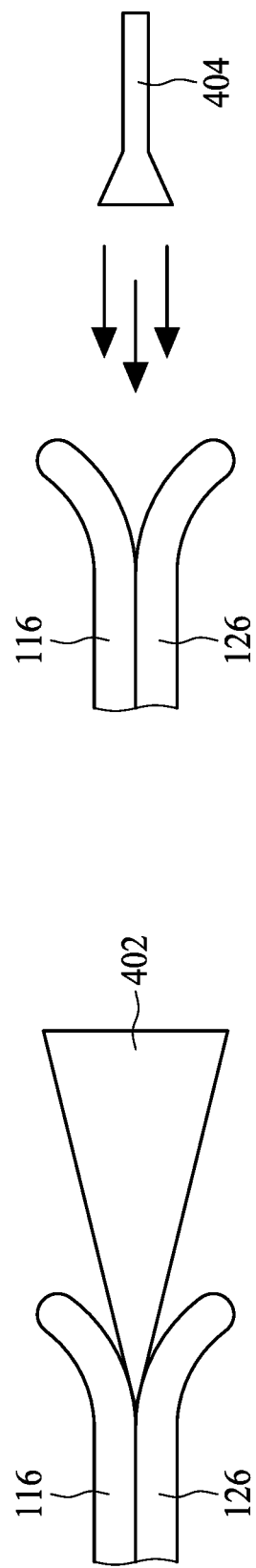
FIG. 4 is a schematic view of a tool kit for semiconductor wafer bonding in accordance with various embodiments of the present disclosure.

In case a defect exists and is detected, the bonding operation is terminated. A rework operation may be initiated for fixing the defect. The rework operation may include detachment of the contacted semiconductor wafers 116 and 126 and resuming of the bonding operation. The detachment may be accomplished by help of a tool kit. Referring to FIG. 4, a blade 402 is used for detaching the first semiconductor wafer 116 from the second semiconductor wafer 126. In some embodiments, the blade 402 includes a tapered shape. The blade 402 may be inserted laterally into the interface between the semiconductor wafers 116 and 126. The blade 402 may move along the bonding interface of the semiconductor wafers 116 and 126 until the two wafers are completely separated. In some embodiments, the blade 402 is made of ceramic materials which may protect the wafer from damage during detachment.

Alternatively, a contact-free tool is used in separating the semiconductor wafers 116 and 126. In some embodiments, the detachment tool kit may include a nozzle 404. The nozzle 404 may be disposed around the first stage 112 or the second stage 122. The nozzle 404 may emit a flow of gas laterally toward the bonding interface of the semiconductor wafers 116 and 126. The gaseous flow may force the half-bonded semiconductor wafers 116 and 126 to completely separate. The gas may be selected from the materials non-reactive with the semiconductor wafers 116 and 126. In some embodiments, the gas may be a noble gas, such as nitrogen gas, or other suitable gas.

Figure 5:
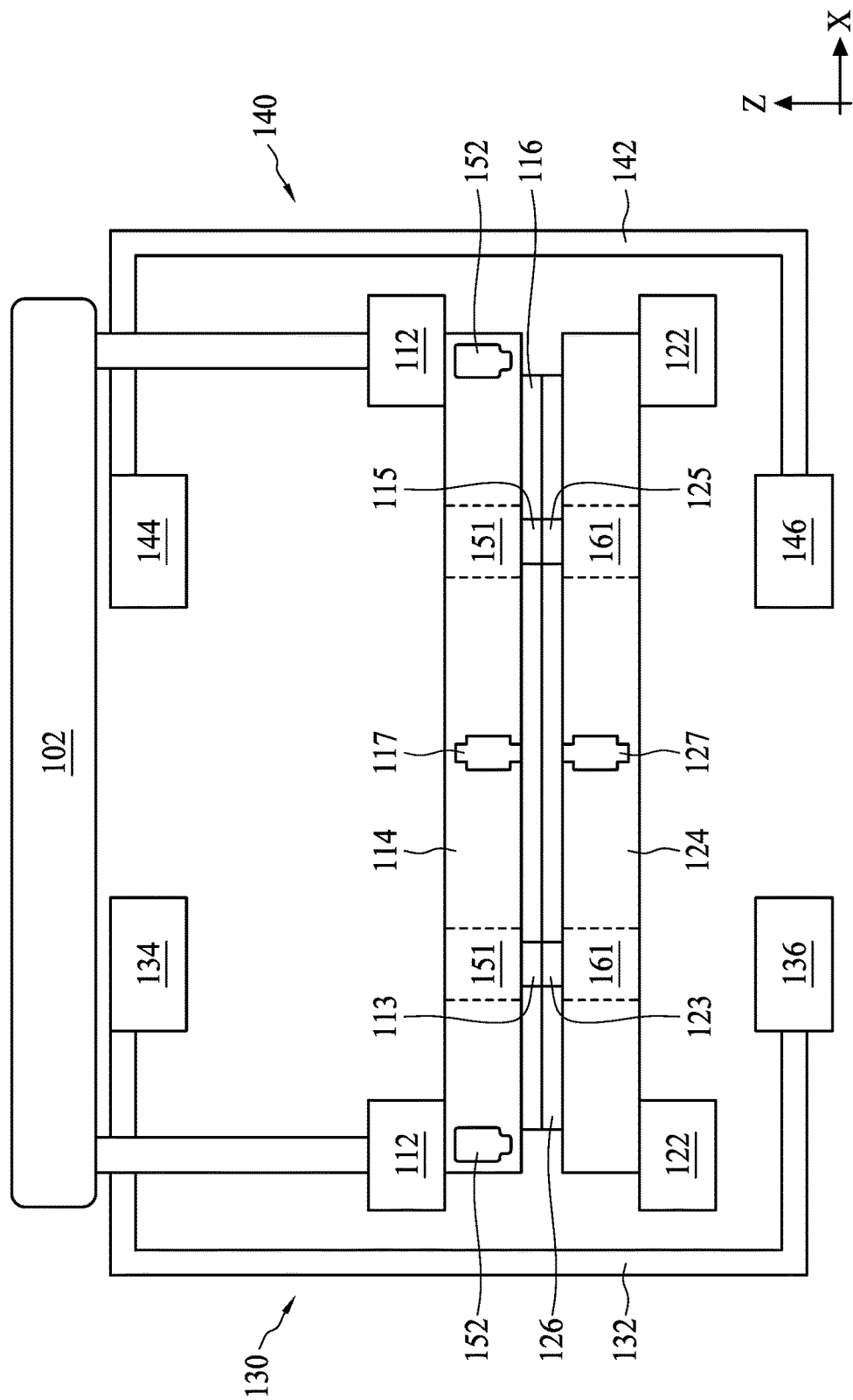
FIG. 5 is a schematic view of the wafer bonding system shown in FIG. 1 and configured in a final phase, in accordance with various embodiments of the present disclosure.

In some embodiments, the attach-inspect-rework procedure may be run one or more rounds until the inspection results, which include alignment accuracy and void detection, are both successful. If the attachment is performed successfully throughout the whole wafer surfaces of the semiconductor wafers 116 and 126, a full attachment is thus achieved. FIG. 5 is a schematic view of the wafer bonding system 100 shown in FIG. 1 in a final phase, in accordance with various embodiments of the present disclosure. The first semiconductor wafer 116 and the second semiconductor wafer 126 are physically bonded. In some embodiments, additional operations, such as thermal treatment, may be performed subsequent to the attaching operation.

Figure 6:
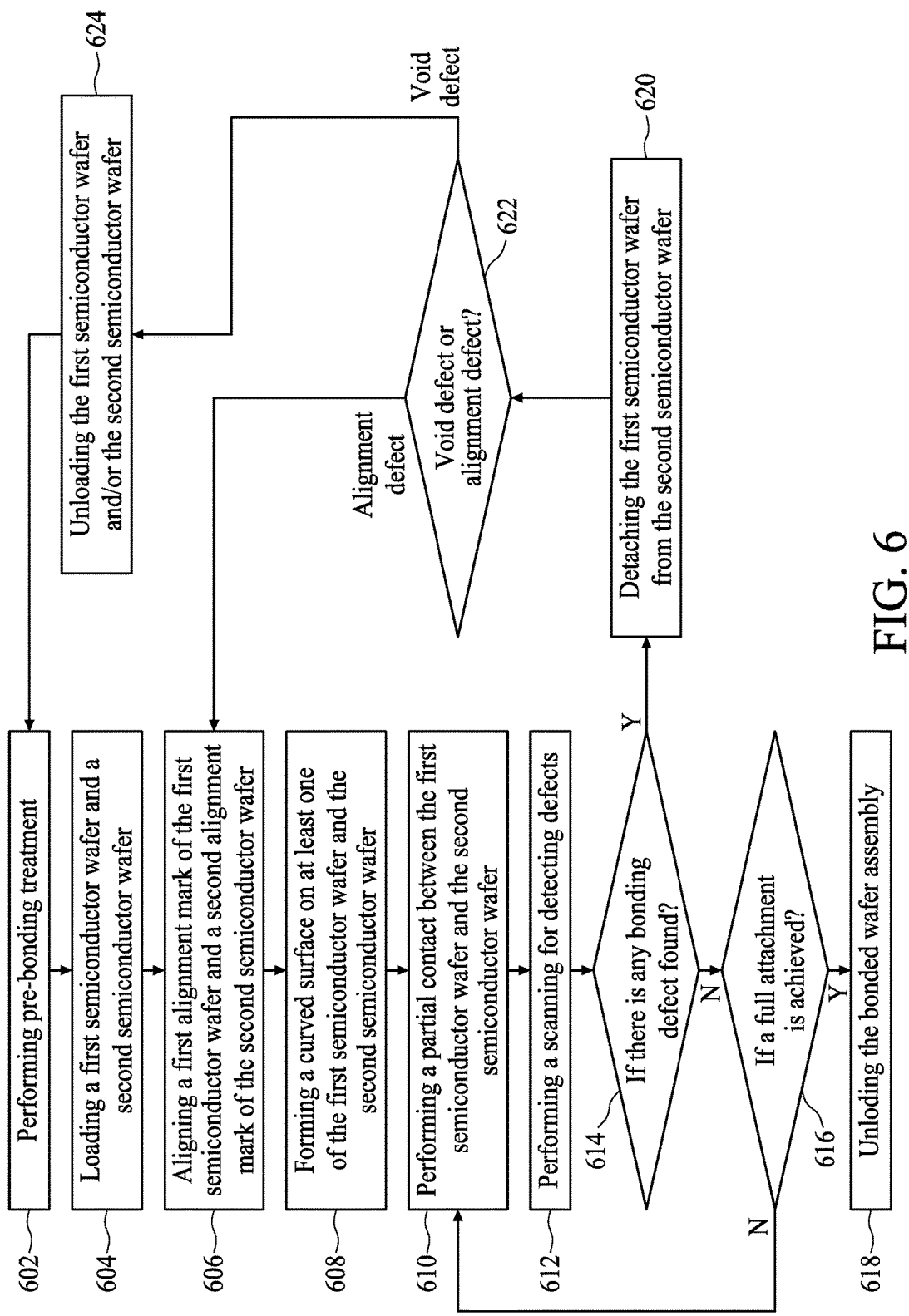
FIG. 6 is a flow diagram showing a method of semiconductor wafer bonding in accordance with various embodiments of the present disclosure.

FIG. 6 is a flow diagram showing a method 600 of semiconductor wafer bonding in accordance with various embodiments of the present disclosure. In the beginning stage of operation, a first semiconductor wafer and a second semiconductor wafer are provided or received in operation 602. A pre-bonding treatment, e.g., a plasma operation, may be performed for the first semiconductor wafer and the second semiconductor wafer.

Subsequently, the first semiconductor wafer and the second semiconductor wafer are loaded to a bonding chamber in operation 604. The first semiconductor wafer and the second semiconductor wafer are placed and clamped on a first wafer chuck and a second wafer chuck, respectively.

In operation 606, a wafer alignment operation is performed in which a first alignment mark on the first semiconductor wafer is aligned with a second alignment mark on the second semiconductor wafer. In some embodiments, once the alignment is finished, the first semiconductor wafer is moved to approach the second semiconductor wafer.

Subsequently, a partial attachment is performed between the first semiconductor wafer and the second semiconductor wafer before a full attachment is achieved. In operation 608, a curved surface is formed on at least one of the first semiconductor and the second semiconductor wafer. In some embodiments, at least one of the first semiconductor wafer and the second semiconductor wafer is warped or bent so as to form the curved surface. The first semiconductor wafer and the second semiconductor wafer may contact at only a portion of their surfaces due to the curved shape of the wafer.

In operation 610, a partial contact is performed between the first semiconductor wafer and the second semiconductor wafer. In some embodiments, the partial contact may occur at respective vertices of the warped first semiconductor wafer or the warped second semiconductor wafer.

Once the first and second semiconductor wafers are in contact, a scanning for detecting defects is performed in operation 612. The defects may include wafer misalignment or bonding void at the interface of partial-contacted interface of the first semiconductor wafer and the second semiconductor wafer. Next, it is determined if a scanning of the bonded semiconductor wafers 116 and 126 detects any bonding defect. The bonding defect may include an alignment error or a bonding void. In some embodiments, the scanning is performed along a direction substantially parallel to a surface of the first semiconductor wafer.

In operation 614, it is determined if there is any bonding defect found. If no bonding defect is found, the method 600 further determines whether a full attachment is achieved in operation 616. If affirmative, the method 600 unloads the bonded wafer assembly from the bonding chamber in operation 618. Otherwise, the method 600 proceeds to operation 610 and continues the partial attachment until a full attachment is achieved.

However, if it is determined that at least one bonding defect is found (either that the alignment error is greater than the threshold or a bonding void is present), the method 600 proceeds with a rework operation. In operation 620, the first semiconductor is detached from the second semiconductor wafer. In some embodiments, a detachment tool may be utilized to separate the partially-contacted semiconductor wafers.

In operation 622, it is further determined whether the bonding defect is a type of alignment error or a type of bonding void. In response to the bonding defect as an alignment error, the method 600 returns to operation 606 and a re-alignment for the first alignment mark and the second alignment mark may be performed anew. Alternatively, in response to the bonding defect as a bonding void, the detached first semiconductor wafer and the second semiconductor wafer are unloaded from the bonding chamber in operation 624. Then, the first semiconductor wafer and the second semiconductor wafer are subjected to a pre-bonding treatment again as illustrated in operation 602. The bonding procedure may be resumed until the full attachment is achieved.

In accordance with one embodiment of the present disclosure, a method of semiconductor wafer bonding is proposed. A first alignment mark of a first semiconductor wafer is aligned with a second alignment mark of a second semiconductor wafer. A partial attachment is performed between the first semiconductor wafer and the second semiconductor wafer. A scanning is performed along a direction substantially parallel to a surface of the first semiconductor wafer. It is determined if a bonding defect of the partially attached first semiconductor wafer and the second semiconductor wafer exists.

In accordance with another embodiment of the present disclosure, a method of semiconductor wafer bonding is provided. A first alignment mark of a first semiconductor wafer is aligned with a second alignment mark of a second semiconductor wafer, where the first alignment mark and the second alignment mark are located in a first area. A partial attachment is performed between the first semiconductor wafer and the second semiconductor wafer. A scanning is performed across the first area and a second area of the first semiconductor wafer and the second semiconductor wafer, where the second area is separate from the first area. It is determined if a bonding defect is found in the first area and the second area.

In accordance with yet another embodiment of the present disclosure, a wafer bonding system is provided. The wafer bonding system includes a first wafer chuck configured to hold a first workpiece. The wafer bonding system also includes a second wafer chuck opposite the first wafer chuck, where the second wafer chuck is configured to hold a second workpiece. The system further includes an imaging device configured to move along a direction substantially parallel to a surface of the first wafer chuck.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor wafer bonding, the method comprising:
    aligning a first alignment mark of a first semiconductor wafer with a second alignment mark of a second semiconductor wafer;
    performing a partial attachment between the first semiconductor wafer and the second semiconductor wafer by engaging central portions of the first semiconductor wafer and the second semiconductor wafer while separating an edge of the first semiconductor wafer from an edge of the second semiconductor wafer;
    performing a scanning on contacted portions of the partially-attached first and second semiconductor wafers along a direction substantially parallel to a surface of the first semiconductor wafer;
    determining if a bonding defect of the partially attached first semiconductor wafer and the second semiconductor wafer exists;
    detaching the first semiconductor wafer from the second semiconductor wafer in response to the determination that a bonding defect exists; and
    fully attaching the first semiconductor wafer with the second semiconductor wafer in response to no bonding defect being found by the scanning.

2. The method of claim 1, wherein detaching the first semiconductor wafer from the second semiconductor wafer comprises causing the first semiconductor wafer to separate from the second semiconductor wafer with a gaseous flow.

3. The method of claim 1, wherein the bonding defect includes a bonding void between the first semiconductor wafer and the second semiconductor wafer.

4. The method of claim 3, further comprising, in response to the determination that a bonding void exists:
    unloading the first semiconductor wafer and the second semiconductor wafer from a process chamber in response to the defect as being detected as a void; and
    performing a pre-bonding treatment for the first semiconductor wafer and the second semiconductor wafer.

5. The method of claim 1, wherein the defect includes an alignment error between the first alignment mark and the second alignment mark as being greater than a threshold.

6. The method of claim 5, wherein the first semiconductor wafer and the second semiconductor wafer are disposed in a process chamber, further comprising, in response to the alignment error being greater than the threshold, re-aligning the first alignment mark and the second alignment mark in the process chamber without unloading the first and second semiconductor wafers.

7. The method of claim 1, further comprising performing a plasma process on the first semiconductor wafer and the second semiconductor wafer prior to aligning the first alignment mark with the second alignment mark.

8. The method of claim 1, wherein performing a scanning along a direction substantially parallel to a surface of the first semiconductor wafer comprises enabling a relative movement between a radiation source and the first semiconductor wafer.

9. The method of claim 8, wherein performing a scanning along a direction substantially parallel to a surface of the first semiconductor wafer further comprises enabling a relative movement of an imaging device along the direction in synchronization with the movement of the radiation source.

10. The method of claim 9, wherein the imaging device and the radiation source are overlapped with each other during the movement along the direction scanning is performed across an area of the surface of the first semiconductor wafer where no alignment mark is present.

11. A method of semiconductor wafer bonding, the method comprising:
    aligning a first alignment mark of a first semiconductor wafer with a second alignment mark of a second semiconductor wafer, the first alignment mark and the second alignment mark being located in a first area;
    performing a partial attachment between the first semiconductor wafer and the second semiconductor wafer while keeping edges of the first semiconductor wafer and the second semiconductor wafer spaced apart from each other;
    performing a progressive scanning across the first area and a second area of the first semiconductor wafer and the second semiconductor wafer by enabling a horizontal movement of a radiation source across the first semiconductor wafer while the edges of the first semiconductor wafer and the second semiconductor wafer are spaced apart, the second area being separate from the first area, wherein performing a scanning across the first area and a second area of the first semiconductor wafer comprises generating an image of the second area and examining a color distribution of the image; and
    determining if a bonding defect is found in the first area and the second area, wherein a bonding void between the first semiconductor wafer and the second semiconductor wafer is determined as being detected based on the color distribution of the image.

12. The method of claim 11, wherein at least one of the first semiconductor wafer and the second semiconductor wafer is held by a wafer chuck, and an imaging light for the scanning is configured to run through a transparent portion of the wafer chuck.

13. The method of claim 11, wherein aligning a first alignment mark of a first semiconductor wafer with a second alignment mark of a second semiconductor wafer comprises locating the first alignment mark and the second alignment mark by a light source movable along a direction substantially parallel to a surface of the first semiconductor wafer.

14. A method of semiconductor wafer bonding, comprising:
    holding a semiconductor wafer and a second semiconductor wafer with a first chuck and a second chuck, respectively;
    aligning a first alignment mark of the first semiconductor wafer with a second alignment mark of the second semiconductor wafer;

warping the first semiconductor wafer toward the second semiconductor wafer by causing a first central area of the first semiconductor wafer and a second central area of the second semiconductor wafers to be separated from the first chuck and the second chuck, respectively, and engaging the first central area to the second central area;

performing a scanning along a direction substantially parallel to a surface of the first semiconductor wafer while the first semiconductor is warped; and fully attaching the first semiconductor wafer with the second semiconductor wafer in response to no bonding defect being found by the scanning.

15. The method according to claim 14, wherein the performing a scanning along a direction substantially parallel to a surface of the semiconductor wafer comprises emitting a radiation source toward the first semiconductor wafer and the second semiconductor wafer across a surface of the first semiconductor wafer.

16. The method according to claim 15, wherein emitting a radiation source toward the first semiconductor wafer and the second semiconductor wafer comprises emitting the radiation source through a first transparent portion of the first chuck and a second transparent portion of the second chuck, the first transparent portion being overlapped with the second transparent portion from a top-view perspective.

17. The method according to claim 14, further comprising taking vertical displacement measurements of the first chuck and the second chuck through a level gauge.

* * * * *